Figure 1:
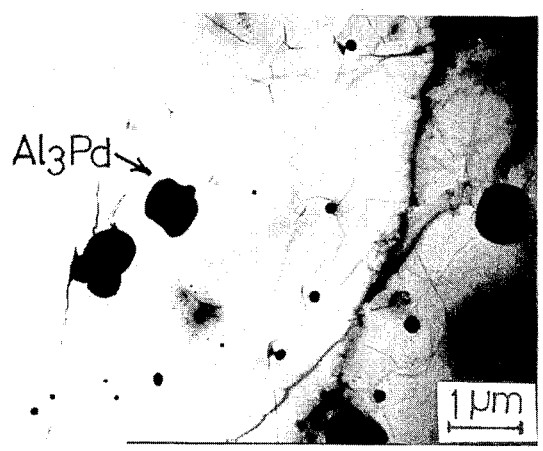

United States Patent [19]

Onuki et al.

[11] Patent Number: 4,912,544
[45] Date of Patent: Mar. 27, 1990

[54] CORROSION-RESISTANT ALUMINUM ELECTRONIC MATERIAL

[75] Inventors: Jin Onuki, Hitachi; Masateru Suwa, Ibaraki; Masahiro Koizumi, Hitachi; Osamu Asai, Hitachi; Katsumi Suzuki, Hitachi; Ryo Hiraga, Hitachiota, all of Japan

[73] Assignee: Hitachi, Ltd., Tokyo, Japan

[21] Appl. No.: 521,899

[22] Filed: Aug. 10, 1983

[30] Foreign Application Priority Data

Aug. 11, 1982 [JP] Japan .................. 57-138608

[51] Int. Cl.$^4$ .............. H01L 23/54; H01L 23/48
[52] U.S. Cl. ........................ 357/67; 357/71; 357/68
[58] Field of Search ........... 357/67, 65, 71, , 72, 357/68; 420/548, 528

[56] References Cited

U.S. PATENT DOCUMENTS

| 2,805,370 | 9/1957 | Wilson | 357/67 |
| 3,258,318 | 6/1966 | Gruhl | 420/528 |
| 4,027,326 | 5/1977 | Kummer et al. | 357/71 |
| 4,080,485 | 3/1978 | Bonkohara | 357/68 |

FOREIGN PATENT DOCUMENTS

| 2347059 | 5/1974 | Fed. Rep. of Germany . |
| 2541206 | 3/1976 | Fed. Rep. of Germany . |
| 0114363 | 9/1981 | Japan ................ 357/70 |

OTHER PUBLICATIONS

Patent Abstracts of Japan, vol. 6, Apr. 17, 1982, p. 47 E 102, and related Japanese Kokai No. 57-1241.

Primary Examiner—Rolt Hille
Assistant Examiner—S. V. Clark
Attorney, Agent, or Firm—Antonelli, Terry & Wands

[57] ABSTRACT

A corrosion-resistant aluminum electronic material comprising an alloy containing aluminum as the principal component and, in addition, a small amount of a noble metal, the content of said noble metal being equal to or less than that at the eutectic point having the primary crystal of aluminum. As the noble metal, there is contained at least one metal selected from Pt, Pd, Rh, Ir, Os, Ru, Au and Ag. Said electronic material is used for ball-bonding wire and distributing film in a semiconductor device, and the like.

9 Claims, 5 Drawing Sheets

CORROSION-RESISTANT ALUMINUM ELECTRONIC MATERIAL This invention relates to an electronic material comprising a novel aluminum alloy and a semiconductor device employing the same.

Previously, the connection between a distributing film consisting of a vacuum coated aluminum film formed on a semiconductor element and an external lead wire was conducted by use of fine gold wire, the connection being effected by heat pressing the wire by means of ball bonding. Hereinafter, the name of each metal element is shown by the symbol of element. In recent years, the use of inexpensive fine Al wire in place of Au wire has been investigated. However, in a semiconductor device sealed with a some of synthetic resins such as epoxy resin, there has been a problem that corrosion occurs in the fine Al wire and vacuum coated Al film. It is considered that because of the moisture permeation through the interface between the synthetic resin and the fine Al wire and the vacuum coated Al film trace amounts of corrosive components such as chloride ion, amine and like contained in the synthetic resin are liberated, which promote the corrosion of the fine Al wire and the vacuum coated Al film.

As an improved fine Al wire, that of Al-Cu alloy containing 3 to 5 percent by weight of Cu is known from Japanese Patent Application "Kokai" (Laid-open) No. 16647/81. But, addition of Cu to Al does not improve the corrosion resistance of the alloy to the above-mentioned synthetic resins.

As an improved vacuum coated Al film, that of an A alloy containing 0.05 to 6 percent by weight of Mn is known from Japanese Patent Application "Kokai" (Laid-open) No. 142988/76. In a vacuum coated Al film containing Mn, however, since Mn is a baser metal than Al, there occurs a problem that the film surface is covered by thick oxide film and hence the bondability with Al wire becomes deteriorated.

Japanese Patent Application "Kokai" (Laid-open) No. 1241/82 discloses that as a metal distribution zone between elements or in an element, there is used an alloy comprising aluminum and a metal which is lower in an ionization tendency than aluminum, and also discloses noble metals as one example thereof. However, said reference is quite silent as to the process for production of and components of said alloy.

The object of this invention is to provide an aluminum electronic material having a superior corrosion resistance without lowering the bondability.

Another object of this invention is to provide a semiconductor device employing an Al alloy having a superior corrosion resistance against synthetic resins containing trace amounts of corrosive components.

Other objects and advantages of this invention will become apparent from the following descriptions.

Figure 2:
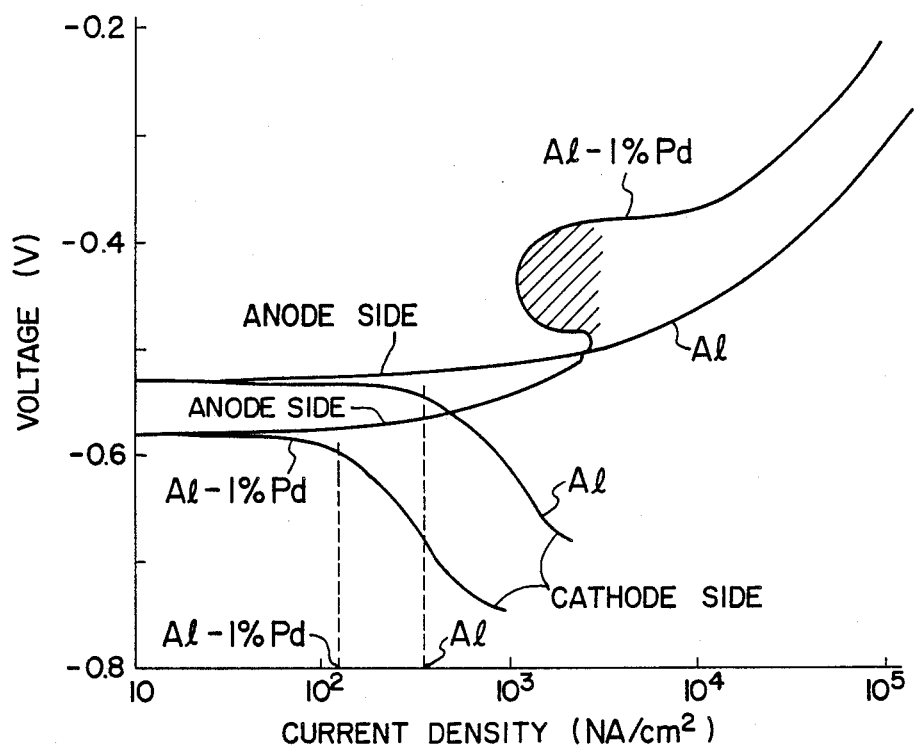
Figure 3:
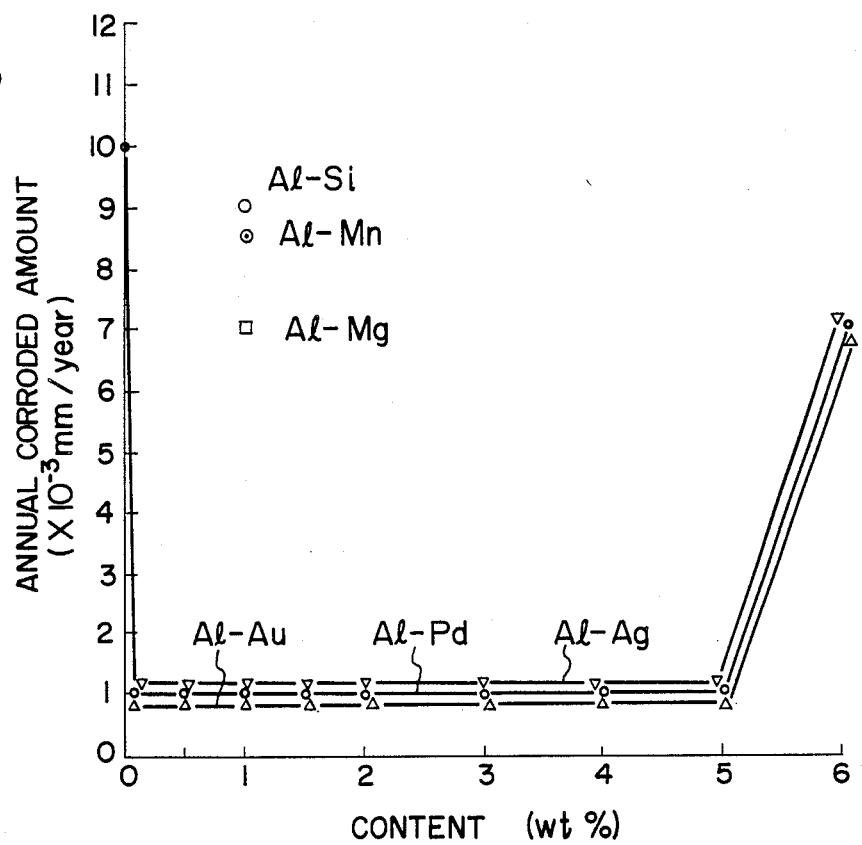
Figure 4:
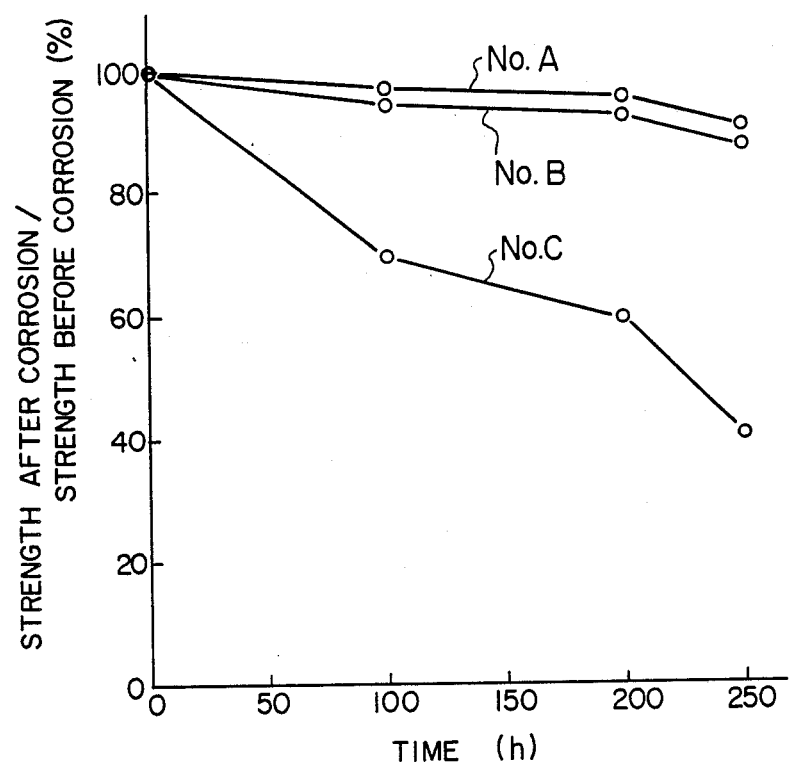
Figure 5:
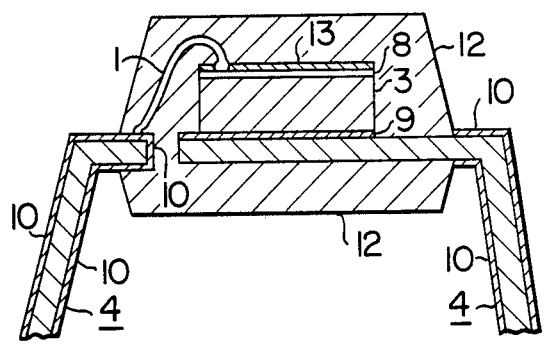
Figure 6:
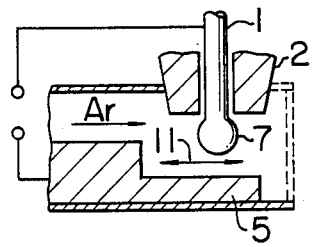
Figure 7:
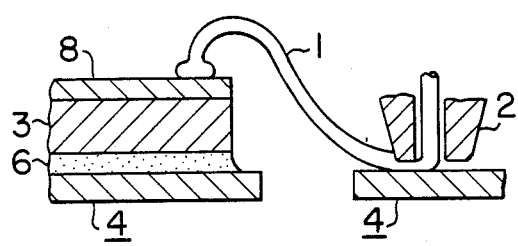
Figure 8:
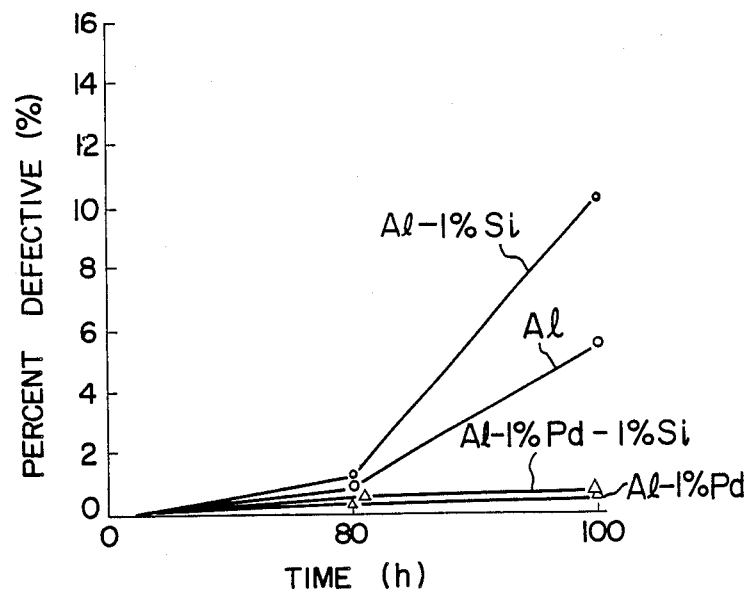
Figure 9:
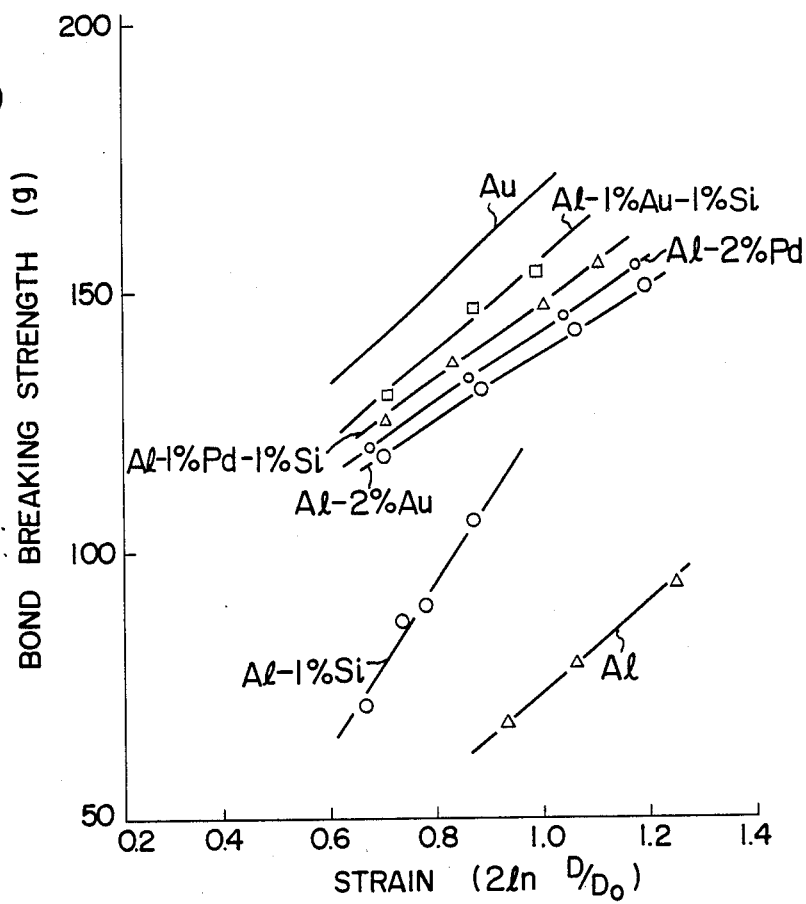

In the accompanying drawings, FIG. 1 is a photomicrograph of Al alloy of this invention, FIG. 2 is a diagram showing a polarization curve, FIG. 3 is a diagram showing the relationship of the annual corroded amount and the content of added elements, FIG. 4 shows relationship between a test time and (strength after corrosion/strength before corrosion, FIG. 5 is a cross-sectional view of a typical resin-mold type semiconductor device, FIG. 6 is a cross-sectional view of the ball-forming part of a ball-forming apparatus by means of arc discharge, FIG. 7 is a partial cross-sectional view of a semiconductor device showing a ball-bonded state, FIG. 8 is a diagram showing percent defective in PCT test, and FIG. 9 is a diagram showing the relation between the bond breaking strength and the strain.

In FIGS. 5 to 7, 1 is a wire, 2 is a capillary, 3 is a Si element, 4 is a lead frame, 5 is a W electrode, 6 is a solder, 7 is a ball, 8 is a vacuum coated Al film, 9 is a low temperature fusing glass, 10 is a layer of Ag plating, 11 is the moving direction of the W electrode, and 12 is a resin.

This invention relates to a corrosion-resistant aluminum electronic material comprising an alloy containing aluminum as the principal component and, in addition, a small amount of a noble metal, the content of said noble metal being equal to or less than that at the eutectic point having the primary crystal of aluminum.

Particles comprising a noble metal or a compound composed of aluminum and the noble metal are distributed in matrix, and an average diameter of the particles should be 1 μm or less. Further, an average distance between particles is preferably 10 μm or less. When the diameter of said particles exceeds 1 μm, the region surrounding said particles is corroded. Although an average distance between the particles depends on the diameter of the particles, if the distance exceeds 10 μm, an aluminum base surrounding the particles is corroded. The distance between particles is more preferably 5 μm or less. These particles can be made in a fine size by solidifying a molten alloy with rapid cooling, and the average distance between particles depends on correlation with the concentration of alloy.

Aluminum metal forms readily a stable passive state coating in the atmosphere, and so has a good corrosion resistance in general. But when Al is in contact with a synthetic resin as in a semiconductor device packaged with a synthetic resin, the passive state coating is destroyed by the action of trace amounts of chloride ion and amines contained in the resin, and the metal is subjected to corrosion. Accordingly, the present inventors have made an extensive study on the cause of corrosion of Al and, as a result, have found that the corrosion can be inhibited by inclusion in Al of a noble metal having much lower hydrogen overvoltage than that of Al. In an alloy formed of Al and a noble metal having a much lower hydrogen overvoltage than that of Al, even when some aluminum dissolves initially, since the noble metal having a low hydrogen overvoltage is electrochemically more noble, it is concentrated in the surface part. Accordingly, it is considered that as the dissolution of the alloy proceeds the hydrogen overvoltage of the alloy itself becomes gradually lower and the potential of the alloy becomes more noble, which causes the passivation of the alloy itself. Since the Al alloy of this invention contains a noble metal which itself forms an oxide film with difficulty, it gives the same degree of bondability in solid-phase bonding as that of Al.

The term "electronic material" used in this invention refers to a material part which is connected electrically to a semiconductor element.

(1) Noble metal

Noble metals having a much lower hydrogen overvoltage than that of Al include Pt, Pd, Rh, Is, Os, Ru, Au and Ag, and the alloy of this invention can contain one or more thereof. These noble metals have very low hydrogen overvoltage as compared with other metals and have themselves very excellent corrosion resistance, so that the formation of a passive state film on the surface of Al alloy is promoted and the corrosion resistance is improved markedly. Particularly preferred are Pd, Au and Ag, and most preferred is Pd.

The increasing order of hydrogen over-voltages of metals in2-normal sulfuric acid solution is as follows: Pd, Pt, Ru, Os, Ir, Rh, Au, Ag, Ni, W, Mo, Fe, Cr, Cu, Si, Ti, Al, Mn.

(2) Content

The content of the noble metal having a lower hydrogen overvoltage than that of Al should be equal to or less than that at the eutectic point having the primary crystal of Al. When a compound formed from a noble metal having a low hydrogen overvoltage and Al crystallizes out as the primary crystal, the resulting crystal is coarse and is difficult to divide finely in a subsequent plastic working, because since the Al base is soft the hard metal is difficultly divided by plastic working. Accordingly, when the proportion of a noble metal having a low hydrogen overvoltage is equal to or less than that at the eutectic point containing the primary crystal of Al, crystallization takes place in the form of fine eutectic crystals, giving a high plastic workability and further a high bondability in solid-phase bonding.

In particular, an alloy having a high plastic workability and bondability comprises 0.01 to 10 percent by weight in total of one or more than one noble metal and substantially the remaining portion of aluminum. In order to obtain an Al alloy having a high corrosion resistance, plastic workability and a high bondability in solid-phase bonding of a ball-bonding wire and a distributing film, the content of one or more than one noble metal in total is preferably 0.05 to 3 percent by weight, particularly preferably 0.05 to 1.0 percent by weight. The eutectic point of each of the binary alloys corresponds to the following noble metal content by weight, respectively: Pd 25%, Pt 19.0%, Au 5.0%, Ag 70.5%.

Furthermore, the alloy of this invention may contain a small amount of Si in addition to a noble metal. The content of Si is preferably 0.5 to 4 percent by weight. Even when Si is contained in the alloy, the content of a noble metal is the same as described above.

(3) Synthetic resin

The Al alloy of this invention is used favorably for articles in which it is employed in contact with a synthetic resin, and is particularly favorable to be used for the ball-bonding wire and the distributing film of a resin-mold type semiconductor device which is sealed with a synthetic resin.

In this type of semiconductor devices, there may be used thermosetting resins such as epoxy resin, addition-type polyester resin and poly-p-vinylphenol resin. Particularly preferred as a sealing material for a semiconductor device is epoxy resin.

(4) Ball-bonding wire

The superfine wire formed from the Al alloy of this invention is useful as a ball-bonding wire, at the tip of which is formed a ball, the ball being solid-phase bonded to a distributing film formed on a semiconductor element, and the other end of which wire is solid-phase bonded to an external lead terminal.

The superfine wire has preferably a diameter of 10 to 100 $\mu$m. The intermetallic compound in the alloy should have a diameter of 1 $\mu$m or less at the largest, and particularly preferably a diameter of 0.5 $\mu$m or less. If the intermetallic compound is present as a large mass in such a superfine wire, the improving effect of noble metal on corrosion resistance is small even when the added amount is the same.

The formation of a fine intermetallic compound of 1 $\mu$m or less in size can be effected by a plastic working subsequent to melting. Particularly, the size of the compound is greatly affected by the cooling rate of molten metal, and an intermetallic compound of fine size can be obtained by cooling the molten metal rapidly. The cooling rate of the molten metal down to the solidification is preferably 20° C./sec or more, and particularly preferred is a rate of 50° C./sec or more. The cooling methods which may be used include one using a water-cooled copper mold or a continuous molding method in which the molten metal is solidified in a water-cooled mold followed immediately by water cooling.

The thickness of the wire varies depending on the elements to be added to the alloy, but is preferably 20 to 70 $\mu$m in diameter. The diameter of the wire is selected from the above range taking, in particular, specific resistance and other factors into consideration.

Since the wire contains alloyed elements as mentioned above, it is preferably to be in an annealed state. The annealing temperature is preferably equal to or above the recrystallization temperature. In particular, the annealing is referably effected to such a degree that it does not cause elastic deformation. Since local difference of hardness in a wire causes a local deformation of wire in ball bonding, it is advantageous that the wire is uniformly softened to give the same hardness throughout the whole, so that it may not be heated locally and not undergo local softening in ball forming. The annealing temperature is preferably 150° to 600° C. The annealing is preferably effected in a non-oxidizing atmosphere. The temperature for final annealing is preferably 150° to 300° C.

Although a wire which has been worked into its final form may be left as it is and annealed at the time when it is bonded to a circuit element, it is far more efficient to bond a wire which has been annealed beforehand.

The specific resistance of a wire at room temperature is preferably 15 $\mu\phi$cm or less.

(5) Ballforming

The ball in ball bonding is formed by melting the tip of a wire held by a capillary by such heating means as electric discharge, hydrogen flame, plasma, arc, or laser beams, the ball being formed by the molten metal's own surface tension. Particularly, a method in which arc discharge or spark discharge is applied between the wire itself and another electrode in vacuum or an inert atmosphere is preferred because, by such method, the ball can be formed in a short time and the formation of an oxide film can be prevented. By applying the arc discharge or spark discharge using the wire as cathode, a ball can be formed which is clean and has no oxide film on the surface and also has no eccentricity. In the arc discharge or spark discharge, it is possible to apply positive and/or negative pulse current, and to control properly, by the pulse current, the arc or spark discharge time necessary for ball-forming. When positive and negative current are applied, the time necessary for cleaning the wire surface and the time necessary for ball-forming can be controlled by varying the time ratio of positive and negative current. The time necessary for cleaning is preferably 10 to 30 percent of the total discharge time.

The atmosphere in which heating and melting is conducted for ball-forming is preferably a non-oxidizing one. In particular, an inert gas containing a small amount, preferably 5 to 15 percent by volume, of a reducing gas (e.g. hydrogen gas) is preferred. Particularly preferred are inert gases such as argon or helium containing 5 to 15 percent by volume of hydrogen.

The diameter of the ball is preferably 5 to 4 times, more preferably 2.5 to 3.5 times, that of the wire.

(6) Bonding

Methods of bonding include ball bonding and wedge bonding. These are effected by ultrasonic bonding or heat pressing. When the circuit element is a semiconductor element, there is a limitation to the bonding gap and hence ball bonding is preferred. In the case of an external terminal, wedge bonding having high efficiency is preferred.

The wire, after bonded to a circuit element, is cut at a point near the bonding part of the circuit element by pulling the wire in a state held by a capillary.

Since the diameter of the wire is very small as mentioned above, it is protected by covering a semiconductor element, wire and a part of an external terminal with ceramic in addition to resin. The resin covering is conducted by casting or molding a liquid resin followed by curing. The ceramic is cap-seal bonded in a usual manner.

(7) Distributing film

The thin film formed of the Al alloy of this invention is particularly useful for a distributing film used as the connecting terminal of a semiconductor element to an external lead wire. The thin film is formed by conventional methods such as vacuum evaporation or spattering. The distribution film is several to several tens $\mu$m in width and several $\mu$m in thickness.

The distribution film is formed from the alloy of this invention by using a target which has been made by solidification with rapid cooling as mentioned above. The alloy solidified by rapid cooling contains particles of noble metal or of a compound composed of said noble metal and aluminum having a diameter of 1 $\mu$m or less, and when said alloy is used the resulting distribution film similarly contains particles having a diameter of 1 $\mu$m or less and has an excellent corrosion resistance. The average distance between the particles is also 10 $\mu$m or less.

This invention will be illustrated in detail below with reference to Examples, but it is not limited thereto.

EXAMPLE 1

By using pure Al of 99.99% purity and Pd of 99.9% purity, a series of Al alloys containing 0, 0.01, 0.1, 0.5, 1, 5, 7, and 10 percent by weight of Pd was molten in a water-cooling copper mold by arc-melting in an atmosphere of argon and made into blocks each having a dimension of 3 cm ×3 cm ×5 mm (thickness). The cooling rate of the molten metal down to solidification in the above operation was at least about 50° C./sec. The alloy was then subjected to a soaking treatment in which it was heated at 550° C. for 24 hours in order to have the Pd in the alloy uniformly solid-dissolved in the alloy, cooled rapidly, and, with an intermediate annealing of 2 hours of heating at 580° C. worked into a plate of 1 mm in thickness and a wire of 1 mm in diameter at room temperature by means of rolling and swaging, respectively. After the above working, each of the products was subjected to final annealing at 200° C. In the case of Al alloy containing 7% and 10% of Pd, the above-mentioned rolling and swaging were more difficult to conduct than in the case of alloys containing smaller amount of Pd. The workability of all of the Al alloys containing 5 percent or less of Pd was only slightly inferior to that of pure Al, and the alloys can be worked easily.

FIG. 1 is a photomicrograph of Al-1% Pd alloy at a magnification of 20,000. The black part in the texture is the Al-Pd intermetallic compound (Al$_3$Pd). Larger ones have a diameter of about 1 $\mu$m and smaller ones have a diameter of about 0.2 $\mu$m. It is observed that they are very fine and distributed uniformly in matrix. Average distance between particles is about 5 $\mu$m.

FIG. 2 shows polarization curves of Al-1% Pd alloy and pure Al as determined in a sulfuric acid solution of pH 3 (20° C.) containing 100 ppm of chloride ion. It can be observed that, while in the case of pure Al both the current density and the corroded amount increase with increasing voltage, in the case of Al-1% Pd alloy of this invention there is a region in which the current density does not increase but conversely decrease with increasing voltage, namely a passive state region (indicated by oblique lines in the Figure). The presence of this region signifies the formation of a passive state coating on the alloy surface.

Similarly, in the case of alloys containing 0.01, 0.1, 0.5, 5, 7 and 10 percent of Pd the presence of a passive state region was also observed. It was observed further that the larger the amount of Pd was, the broader the passive state region became.

The corrosion rate as calculated from the polarization curve shown in FIG. 2 was 0.010 mm/year for pure Al (99.99% or higher) and 0.001 mm/year for Al-1% Pd alloy. It can be see that the corrosion rate of the alloy of this invention is one tenth of that of pure Al, the corroded amount of the former being very small.

In the same manner as described above, plates were made of Al alloys containing 1 percent of Si, 1 percent of Mn, and 1 percent of Mg (all by weight) and Al alloys containing 0.1 to 6 percent by weight of Pd, Au or Ag, and the polarization curves were determined also for these alloys. The annual corroded amounts obtained from these curves were 0.009 mm/year for Si alloy, 0.0085 mm for Mn alloy, and 0.007 mm/year for Mg alloy, whereas they were 0.001 mm/year for all of the alloys containing percent by weight or less of Au, Ag or Pd.

The polarization curve was determined on a specimen having an area of 1 cm$^2$ in a sulfuric acid solution at pH 3 (25° C) containing 100 ppm of chloride ion.

FIG. 3 is a graph showing the relation between the annual corroded amount and the content of added element.

Next, a wire having a diameter of 50 $\mu$m, which had been prepared from an Al-1%Pd alloy in the same manner as mentioned above by controlling the rate of solidification, was allowed to stand at 120° C in a steam of 2 atmospheric pressure and the subjected to tensile test. The particles in the alloy is a compound of Al and Pd, (Al$_3$Pd), and the average diameter thereof is 0.2 $\mu$m in No. A, 1 $\mu$m in No. B and 3 $\mu$m in No. C and an average distance between particles is 3 $\mu$m in No. A, 10 $\mu$m in No. B and 20 $\mu$m in No. C, respectively.

FIG. 4 shows relationship between a test time and (strength after corrosion/strength before corrosion). As shown in FIG. 4, the alloy of this invention, No. A and No. B, are high in the strength because of no corrosion, but No. C for comparison was corroded at the base surrounding Al$_3$Pd, and the strength was remarkably lowered.

EXAMPLE 2

Aluminum alloys containing 1 percent of Si, Mn, Pt, Rh, Ru and Os, 2 percent of Mg, and 0.5 to 6 percent of Au, Ag and Pd (all by weight) were arc-molten in the same manner as in Example 1 and, after swaging as n Example 1, subjected to repeated wire drawing and annealing to give wires having a diameter of 50 μm. The elemental metals used for alloying were all of a purity of 99.99% or higher. Numbers 3 to 9 refers to the alloys of this invention and No. 2, an Al-1% Si alloy, is that for comparison.

Table 1 shows, for each wire, the elongation percentage on elongation test before and after a high temperature and high humidity test in which the wire specimen is kept for 1000 hours in an atmosphere of 85° C. and 90% humidity.

TABLE 1

| No. | Alloy | Elongation percentage before test (%) | Elongation percentage after 1000 hours (%) |
| --- | --- | --- | --- |
| 1 | Al | 5 | 0.5 |
| 2 | Al-1% Si | 4 | 0.5 |
| 3 | Al-1% Pd | 5 | 4 |
| 4 | Al-1% Pt | 5 | 4 |
| 5 | Al-1% Rh | 3 | 2 |
| 6 | Al-1% Ru | 3 | 2 |
| 7 | Al-1% Au | 5 | 4 |
| 8 | Al-1% Os | 3 | 2 |

It is observed, as shown in the Table, that Nos. 3 to 8 Al alloys of this invention have all a high elongation percentage after the test as compared with pure Al or Al-1% Si alloy.

Similarly, the result of tests performed on wires of 50 μm in diameter formed of Al alloys containing 0.1, 0.5 and 5 percent respectively of Pt, Pd, Rh, Ru, Os or Au showed that the elongation percentage of these alloys were all approximately the same as that of an Al alloy containing 1 percent of these metals.

Table 2 shows, for each wire, the relation between the strength and the elongation percentage after the wire has been exposed to steam at 120° C. and 2 atm for 100 hours. These values of strength and elongation percentage are expressed in percentage with the vales before test being put as 100%.

The result reveals that wires of Al-1%Si, Al, Al-1%Mn, and Al-2%Mg show a value of zero in both strength and elongation percentage after 100 hours of PCT (Pressure Cooker Test), and wires of alloys in which 6 percent of Pd, Au or Ag was added to Al or 5 percent of Si was added to AAl show considerable lowering in elongation and strength. It can also be observed, however, that specimens other than those mentioned above show virtually no lowering in strength and elongation.

TABLE 2

| Alloy | After 100 hours of PCT | |
| --- | --- | --- |
| | Strength (%) | Elongation (%) |
| Al | 0 | 0 |
| Al-1% Si | 0 | 0 |
| Al-1% Mn | 0 | 0 |
| Al-2% Mg | 0 | 0 |
| Al-0.5% Pd | 97 | 93 |
| Al-1% Pd | 96 | 90 |
| Al-2% Pd | 96 | 90 |
| Al-0.5% Pd-1% Si | 98 | 92 |
| Al-1% Pd-1% Si | 97 | 90 |

TABLE 2-continued

| Alloy | After 100 hours of PCT | |
| --- | --- | --- |
| | Strength (%) | Elongation (%) |
| Al-2% Pd-1% Si | 96 | 90 |
| Al-1% Pd-2% Si | 96 | 90 |
| Al-6% Pd-2% Si | 60 | 20 |
| Al-0.5% Au | 98 | 92 |
| Al-1% Au | 96 | 90 |
| Al-2% Au | 97 | 92 |
| Al-0.5% Au-1% Si | 99 | 88 |
| Al-1% Au-1% Si | 98 | 90 |
| Al-2% Au-1% Si | 96 | 90 |
| Al-1% Au-2% Si | 97 | 90 |
| Al-6% Au-2% Si | 65 | 25 |
| Al-1% Au-5% Si | 60 | 20 |
| Al-0.5% Ag | 96 | 90 |
| Al-1% Ag | 97 | 92 |
| Al-2% Ag | 95 | 90 |
| Al-0.5% Ag-1% Si | 98 | 90 |
| Al-1% Ag-1% Si | 98 | 90 |
| Al-2% Ag-1% Si | 96 | 90 |
| Al-1% Ag-2% Si | 92 | 90 |
| Al-6% Ag-2% Si | 50 | 20 |

EXAMPLE 3

FIG. 5 is a cross-sectional view of a typical resin-mold type semiconductor device employing a wire having a diameter of 50 μm formed of pure Al, Al-1%Si or Al-1%Pd alloy prepared in Example 2. Fifty pieces of the resin-mold type semiconductor devices were manufactured for each wirer. Each of the wire used was incompletely annealed, that is, subjected to final annealing at 200 to 300° C. before ball-forming.

Each of the Al wire, 1, was ball-bonded to a semiconductor element, 3, provided with a vacuum coated Al film, and was wedge-bonded to a lead frame, 4, provided with a layer of Ag plating, 10. After the ball bonding, a protective coating, 13, of SiO2 etc. was provided and then a liquid epoxy resin was cast by use of a mold, and then cured to form the semiconductor device shown in the Figure. As the lead frame, there was used Cu or Fe-42%Ni alloy.

The ball, 7, for bonding was formed, as shown in FIG. 6, by pushing out the Al wire through a capillary, 2, and applying a spark discharge thereto. By using each of the Al containing wires mentioned above, in an atmosphere replaced with argon gas containing 7 percent by volume of hydrogen after evacuation, a short-time discharge of less than 1 millisecond was applied between the wire, 1, and an electrode, 5, under discharge conditions of 1000 V and 1 to 5-A to form a true spherical ball at the wire tip. The discharge was applied between the electrode, 5, formed of W and the wire. The ball obtained by the discharge was ball-bonded, as shown in FIG. 7, to a vacuum coated Al film, 8, formed on the semiconductor element with the aid of a capillary, 2, by means of an ultrasonic bonding made by the friction between the wire and the vacuum coated film. The other end of the wire was wedge-bonded to the layer of Ag plating of lead frame, 4, similarly with the aid of the capillary, 2, and similarly by means of an ultrasonic bonding. The bondability of the alloy of this invention by the ultrasonic bonding was excellent, being approximately the same as that of pure Al wire.

The ball obtained by the above method and formed of the alloy of this invention had a good shape which is close to a true sphere, although an egg-shaped ball slightly longer in the wire axis direction was sometimes formed. The ball formed of the alloy of this invention had a glossy and extremely smooth surface, had a hardness nearly equal to that of the wire itself, and was confirmed to give a neat loop-shaped bonding as shown in the Figure. When the wire is cut after wedge bonding by drawing the wire by lifting the capillary, cutting is effected very easily because of the wire being soft. Further, no peeling off of the bonding part due to the above-mentioned drawing was observed at al.

Fifty pieces of each of the resin-mold type semiconductor device prepared as above were subjected to a pressure cooker test (PCT) in which the specimens were kept in a steam at 120° C. and 2 atm for 160 hours, to determine the percent defective due to the disconnection of lead wire by corrosion, the error of the element, etc. The results were as shown in FIG. 8. The Figure showed that while devices formed of pure Al and Al-1%S alloy all gave percent defective of 5 to 10%, those formed of Al-1%Pd alloy of this invention gave percent defective of only about 0.2%, showing thus a very excellent corrosion resistance.

In the same manner as described in Example 1, by using pure Al of 99.99% by weight and Si, Pd and Au, each of purity of 99.9%, there were prepared fine wires having a diameter of 30 μm formed of following alloys: Al-1%Si, Al-1%Pd-1%Si, Al-1%Au-1%Si, Al-2%Pd and Al-2%Au (all % were by weight). These fine wires were annealed in the same manner as described above and were subjected to a short-circuit discharge of 1000 V and 3 A to form a ball having a diameter of about 80 μm.

The ball thus obtained was pressed onto an aluminum pad on Si, bonded by applying an ultrasonic wave, and examined for its bond strength.

FIG. 9 is a diagram showing the relation between the bond breaking strength and the strain (expressed by $2 \ln D/D_o$, wherein $D_o$ is the ball diameter and $D$ is the ball diameter after bonding). As is shown by the Figure, the bond strength increases with increasing strain in all of the wires tested. It is observed that although wires formed of alloys Al-1%Pd-1%Si, Al-1%Au-1%Si, Al-2%Pd, and Al-2%Au have bond strength close to that of Au wire, wires formed of Al-1%Si and Al have considerably lower bond strength.

EXAMPLE 4

In place of the vacuum coated Al film, 8, shown in FIG. 5 in Example 3, an Al-1%Pd alloy plate of 1 mm thickness prepared in Example 1 and an Al-1%Si alloy plate of 1 mm thickness shown in Example 3 were used respectively as a source for vacuum evaporation, to form a vacuum coated film of 1 μm thickness on a S semiconductor element. The resulting film was subjected to pressure cooker test similar to that in Example 2 for 500 hour.. The conditions for vacuum evaporation were, in every case, as follows: substrate temperature 200° C., degree of vacuum 2 to $20 \times 10^{-6}$ Torr., deposition rate 200 ° Å/sec. After the PCT was conducted, the vacuum coated film was examined for its surface state by a scanning electron microscope. The results revealed that while in the Al-1%Si alloy the corrosion proceeded preferentially from the intergranular boundary, in the Al-1%Pd alloy of this invention almost no corrosion was observed. The composition of the vacuum coated film was approximately the same as that of the alloy plate.

In the same manner as described above, three-layer films of Al/d/Al, Al/Au/Al and Al/Ag/Al were prepared on a heat-oxidized $SiO_2$ film by vacuum evaporation and were heated in nitrogen gas of high purity of 99.9999% to produce alloy films having a thickness of 1 μm. The content of Pd, Au and Ag was varied by the control of film thickness. Aluminum alloy films containing 0, 0.5, 1, 2, 4 and 6 percent by weight of Pd, Au and Ag respectively were allowed to stand in steam at 120° C. and 2 atm for 50, 100 and 200 hours (conditions used conventionally for testing a resin-sealed semiconductor) and then the film conditions were inspected. The results revealed that while in pure Al film corrosion was observable as early as after 50 hours, the alloy films showed almost no corrosion even after 200 hours except that in alloy films containing 6 percent of Pd, Ag or Au corrosion was observed after 100 hours.

Separately, a series of films was prepared by adding as the third element 0.5, 1, 2, 3, 4 and 5 percent by weight of Si to the above-mentioned Al-Pd, Al-Au, and Al-Ag film and tested in the same manner as described above. The results revealed that almost no corrosion was observable even after 200 hours in all cases except that corrosion was observed in the film containing 5 percent by weight of Si after 100 hours.

Table 3 shows corrosion state of each alloy film in PCT. The symbol o indicates that no corrosion was observed and the symbol x indicates that corrosion was observed. The particles of novel metal in thin alloy film of this invention had 1 μm at largest and about 0.2 μm at minimum in size.

TABLE 3

| Alloy | PCT time (hours) 0 — 50 — 100 — 150 — 200 |
|---|---|
| Al | o—→ |
| Al—0.5% Pd | o—o—o—o—o |
| 1% Pd | o—o—o—o—o |
| 2% Pd | o—o—o—o—o |
| 4% Pd | o—o—o—o—o |
| 6% Pd | o—o—x |
| Al—0.5% Pd—0.5% Si | o—o—o—o—o |
| 1% Pd—0.5% Si | o—o—o—o—o |
| 2% Pd—0.5% Si | o—o—o—o—o |
| 4% Pd—0.5% Si | o—o—o—o—o |
| 6% Pd—0.5% Si | o—o—x |
| Al—1% Si | o—x |
| Al—1% Pd—1% Si | o—o—o—o—o |
| 1% Pd—1% Si | o—o—o—o—o |
| 2% Pd—1% Si | o—o—o—o—o |
| 4% Pd—1% Si | o—o—o—o—o |
| 6% Pd—1% Si | o—o—x |
| Al—1% Pd—2% Si | o—o—o—o—o |
| 2% Pd—2% Si | o—o—o—o—o |
| 2% Pd—2% Si | o—o—o—o—o |
| 4% Pd—2% Si | o—o—o—o—o |
| 6% Pd—2% Si | o—o—x |

TABLE 3-continued

| Alloy | PCT time (hours) |
|---|---|
| Al—1% Pd—5% Si | |
| 5% Pd—5% Si | |
| 2% Pd—5% Si | |
| 4% Pd—5% Si | |
| 6% Pd—5% Si | |

EXAMPLE 5

Fifty pieces of resin-mold type semiconductor devices were prepared by conducting ball bonding and wedge bonding in the same manner as shown n Example 3 using, in place of the vacuum coated Al film shown in FIG. 4 of Example 3, a vacuum coated Al-1%Pd film of 1 μm thickness which had been formed in the same manner as in Example 4 and using, at the same time, as the wire 1 in FIG. 5 an Al-1%Pd alloy wire of 50 μm in diameter obtained in Example 2, and by further sealing with an epoxy resin in the same manner as in Example 3. These devices were subjected to PCT for 160 hours. The results revealed that none of them became defective at all and their corrosion resistance was excellent. The particles of novel metal in thin alloy film of this invention had 1 μm at largest and about 0.2 μm at minimum in size.

EXAMPLE 6

A thin alloy film was formed in place of Al vacuum coated film in the same manner as in Example 3 by using, as target, alloys of Al-1%Pd and Al-1%Au prepared by varying the rate of solidification. Table 4 shows the results obtained in a test in which samples were allowed to stand in steam in the same manner as mentioned above. Samples No. A, No. B and No. C have been prepared in the same condition as mentioned above. They are same in the average particle diameter and average distance between the particles. Particles composed of a novel metal in these thin film were nearly same to the target. As mentioned in Table 4, No. A and No. B of this invention are excellent in corrosion resistance, but No. C for comparison is poor in corrosion resistance. It was observed that in case of No. C, the aluminum base surrounding the particle was corroded, but there occurred no such corrosion in cases of No. A and No. B of this invention.

TABLE 4

| Alloy | PCT time (hours) |
|---|---|
| | 0  50  100  150  200 |
| Al—1% Pd (No. A) | |
| Al—1% Pd (No. B) | |
| Al—1% Pd (No. C) | |
| Al—1% Au (No. A) | |
| Al—1% Au (No. B) | |
| Al—1% Au (No. C) | |

What is claimed is:

1. In a semiconductor device which is provided with a semiconductor element, a distributing film arranged on said semiconductor element, a fine metal wire bonded to said distributing film, and a lead frame bonded with the other end of said fine wire, said semiconductor element and fine wire being covered with a synthetic resin, the improvement which comprises at least one of said fine wire and said distributing film consisting essentially of an alloy containing aluminum as the principal component and, in addition, at least one noble metal selected from the group consisting of platinum, palladium, rhodium, iridium, osmium, ruthenium, gold and silver, the content of said noble metal being 0.01 to 10% by weight and the remainder being substantially aluminum, and the average diameter of particles comprising said noble metal or a compound composed of said noble metal and aluminum in the alloy being 1 μm or less.

2. A semiconductor device according to claim 1, wherein said fine metal wire is obtained by cooling the molten alloy at the cooling rate of 20° C./sec or more to cool and solidify the alloy, annealing the alloy and rolling or swaging and again annealing.

3. A corrosion-resistant aluminum electronic material according to claim 1, wherein the content of said noble metal is 0.05 to 3 percent by weight and the remainder consists substantially of aluminum.

4. A semiconductor device according to claim 1, wherein said synthetic resin is an epoxy resin.

5. A semiconductor device according to claim 1, wherein a ball formed of said fine wire at the tip of said fine metal wire is solid-phase bonded to said distributing film.

6. In a semiconductor device which is provided with a semiconductor element, a distributing film arranged on said semiconductor element, a fine metal wire bonded to said distributing film, and a lead frame bonded with the other end of said fine wire, said semiconductor element and fine wire being covered with a synthetic resin, the improvement which comprises at least one of said fine wire and said distributing film consisting essentially of an alloy containing aluminum as the principal component and, in addition, at least one noble metal selected from the group consisting of platinum, palladium, rhodium, iridium, osmium, ruthenium, gold and silver, and silicon, the content of said noble metal being 0.01 to 10% by weight, the content of silicon being 0.5 to 4% by weight and the remainder being substantially aluminum, and the average diameter of particles comprising said noble metal or a compound composed of said noble metal and aluminum in the alloy being 1 μm or less.

7. A semiconductor device according to claim 6, wherein said synthetic resin is an epoxy resin.

8. A semiconductor device according to claim 6, wherein a ball formed of said fine wire at the tip of said fine metal wire is solid-phase bonded to said distributing film.

9. A semiconductor device according to claim 6, wherein said fine metal wire is obtained by cooling the molten alloy at the cooling rate of 20° C./sec or more to cool and solidify the alloy, annealing the alloy and rolling or swaging and again annealing.

* * * * *